(12) United States Patent
Jain et al.

(10) Patent No.: US 9,825,157 B1
(45) Date of Patent: Nov. 21, 2017

(54) HETEROJUNCTION BIPOLAR TRANSISTOR WITH STRESS COMPONENT

(71) Applicant: GLOBALFOUNDRIES INC., Grand Cayman (KY)

(72) Inventors: Vibhor Jain, Essex Junction, VT (US); Renata A. Camillo-Castillo, Williston, VT (US); Anthony K. Stamper, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/196,920

(22) Filed: Jun. 29, 2016

(51) Int. Cl.
| | |
|---|---|
| *H01L 29/73* | (2006.01) |
| *H01L 29/08* | (2006.01) |
| *H01L 29/16* | (2006.01) |
| *H01L 29/66* | (2006.01) |
| *H01L 29/737* | (2006.01) |
| *H01L 29/161* | (2006.01) |
| *H01L 29/165* | (2006.01) |

(52) U.S. Cl.
CPC ...... *H01L 29/7378* (2013.01); *H01L 29/0826* (2013.01); *H01L 29/16* (2013.01); *H01L 29/161* (2013.01); *H01L 29/165* (2013.01); *H01L 29/1608* (2013.01); *H01L 29/66242* (2013.01)

(58) Field of Classification Search
CPC . H01L 29/7378; H01L 29/0826; H01L 29/16; H01L 29/1608; H01L 29/161; H01L 29/165; H01L 29/66242
See application file for complete search history.

(56) References Cited

U.S. PATENT DOCUMENTS

| | | | | |
|---|---|---|---|---|
| 4,819,052 A | * | 4/1989 | Hutter | H01L 21/743 257/374 |
| 4,868,631 A | * | 9/1989 | Hollingsworth | H01L 21/763 257/517 |
| 5,049,968 A | * | 9/1991 | Nakagawa | H01L 21/761 257/146 |
| 5,097,314 A | * | 3/1992 | Nakagawa | H01L 21/761 257/500 |
| 5,104,816 A | * | 4/1992 | Verret | H01L 29/66272 257/E21.375 |
| 5,332,920 A | * | 7/1994 | Nakagawa | H01L 21/761 257/140 |
| 6,686,251 B2 | * | 2/2004 | Igarashi | H01L 29/0804 257/E21.375 |

(Continued)

OTHER PUBLICATIONS

Kumar et al., "A Simple, Unified 3D Stress Model for Device Design in Stress-Enhanced Mobility Technologies", SISPAD 2012, Sep. 5-7, 2012, Denver, CO, USA, 4 pages.

(Continued)

*Primary Examiner* — Ida M Soward
(74) *Attorney, Agent, or Firm* — Michael LeStrange; Andrew M. Calderon; Roberts Mlotkowski Safran Cole & Calderon, P.C.

(57) ABSTRACT

The present disclosure relates to semiconductor structures and, more particularly, to a heterojunction bipolar transistor with a stress component and methods of manufacture. The heterojunction bipolar transistor includes a collector region, an emitter region and a base region. Stress material is formed within a trench of a substrate and surrounding at least the collector region and the base region.

15 Claims, 4 Drawing Sheets

(56) References Cited

U.S. PATENT DOCUMENTS

| | | | |
|---|---|---|---|
| 6,737,722 B2 * | 5/2004 | Yamamoto | H01L 29/1008 257/500 |
| 6,812,108 B2 * | 11/2004 | Hemmenway | H01L 21/763 257/E21.004 |
| 6,924,202 B2 * | 8/2005 | Li | H01L 29/0817 257/183 |
| 6,927,118 B2 * | 8/2005 | Idota | H01L 21/8249 257/E21.371 |
| 7,102,205 B2 | 9/2006 | Chidambarrao et al. | |
| 7,262,484 B2 | 8/2007 | Dunn et al. | |
| 7,329,941 B2 | 2/2008 | Chidambarrao et al. | |
| 7,786,510 B2 | 8/2010 | Shim et al. | |
| 7,868,414 B2 * | 1/2011 | Williams | H01L 21/761 257/511 |
| 7,898,008 B2 * | 3/2011 | Fallica | H01L 21/84 257/273 |
| 7,902,630 B2 * | 3/2011 | Disney | H01L 21/761 257/197 |
| 8,361,847 B2 | 1/2013 | Johnson et al. | |
| 9,450,381 B1 * | 9/2016 | Cai | G02B 6/122 |
| 9,608,096 B1 * | 3/2017 | Camillo-Castillo | H01L 29/732 |
| 2005/0020003 A1 * | 1/2005 | Johansson | H01L 27/0635 438/207 |
| 2005/0035470 A1 | 2/2005 | Ko et al. | |
| 2006/0043529 A1 | 3/2006 | Chidambarrao et al. | |
| 2007/0145378 A1 | 6/2007 | Agarwal et al. | |
| 2013/0062670 A1 | 3/2013 | Wong et al. | |
| 2016/0284814 A1 * | 9/2016 | Grivna | H01L 29/7397 |

OTHER PUBLICATIONS

Taiwanese Office Action for related TW Application No. 105126731 dated Jul. 18, 2017, 12 pages.

\* cited by examiner

HETEROJUNCTION BIPOLAR TRANSISTOR WITH STRESS COMPONENT

FIELD OF THE INVENTION

The present disclosure relates to semiconductor structures and, more particularly, to a heterojunction bipolar transistor with a stress component and methods of manufacture.

BACKGROUND

A heterojunction bipolar transistor (HBT) is a type of bipolar junction transistor (BJT) which uses differing semiconductor materials for the emitter and base (or base and collector) regions, creating a heterojunction. The HBT can handle signals of very high frequencies, up to several hundred GHz. It is commonly used in modern circuits, mostly radio-frequency (RF) systems, and in applications requiring a high power efficiency, such as RF power amplifiers in cellular phones.

To increase the performance of the current generation of HBTs it is necessary to lower parasitic resistances and capacitances such as base resistance (Rb), collector base capacitance (Ccb) and base-emitter capacitance (Cbe). A higher ft/fmax and improved kirk current limit will also increase performance of the HBT.

SUMMARY

In an aspect of the disclosure, a structure comprises: a collector region, an emitter region and a base region; and stress material formed within a trench of a substrate and surrounding at least the collector region and the base region.

In an aspect of the disclosure, a heterojunction bipolar transistor comprises: a collector region formed of a substrate material; a base region above the collector region and formed of an intrinsic base layer; an emitter region above the base region and formed of an emitter material; a trench formed in the substrate and surrounding the base region and the collector region; and stress material formed within the trench and providing a stress component to the collector region and the base region.

In an aspect of the disclosure, a method comprises: forming a collector region of a substrate material; forming a base region above the collector region; forming an emitter region above the base region; forming a trench in the substrate and surrounding the base region and the collector region; and forming stress material of semiconductor material within the trench and which provides a stress component to the collector region and the base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a heterojunction bipolar transistor with a stress component and methods of manufacture. More specifically, the present disclosure teaches a heterojunction bipolar transistor (HBT) with a lateral stress placed on the two-dimensional channel region. In embodiments, the lateral stress can be provided by, e.g., SiGe or SiC stressor material in trenches adjacent to the FET channel. Advantageously, the stressor material described herein provides improved carrier mobility in the base region and collector region of the HBT for lower base resistance (Rb), and higher current gain cut-off frequency ft, as well as lower parasitic capacitance, e.g., lower collector base capacitance (Ccb) which improves power gain cut-off frequency, fmax. This results in higher performing HBTs, compared to known structures.

By way of example, it has been observed that depositing a compressive stress layer of approximately 3 GPa will impose a maximum tensile stress in the intrinsic device of approximately 280 MPa-400 MPa. This results in an electron mobility enhancement of approximately 1.08-1.18. In addition, it has been observed that by using a nitride sidewall layer having a stress of 3 GPa and 30% SiGe deposited in a trench adjacent to the channel region, a maximum tensile stress in the intrinsic device can be approximately 300 MPa with a mobility enhancement of approximately 10%. This is an increase of approximately 10-18% mobility, compared to a conventional device. Simulations show Ft and Fmax improve by approximately 10% with both these changes.

The HBT of the present disclosure can be manufactured in a number of ways using a number of different tools. In general, though, the methodologies and tools are used to form structures with dimensions in the micrometer and nanometer scale. The methodologies, i.e., technologies, employed to manufacture the HBT of the present disclosure have been adopted from integrated circuit (IC) technology. For example, the structures are built on wafers and are realized in films of material patterned by photolithographic processes on the top of a wafer. In particular, the fabrication of the HBT uses three basic building blocks: (i) deposition of thin films of material on a substrate, (ii) applying a patterned mask on top of the films by photolithographic imaging, and (iii) etching the films selectively to the mask.

Figure 1:
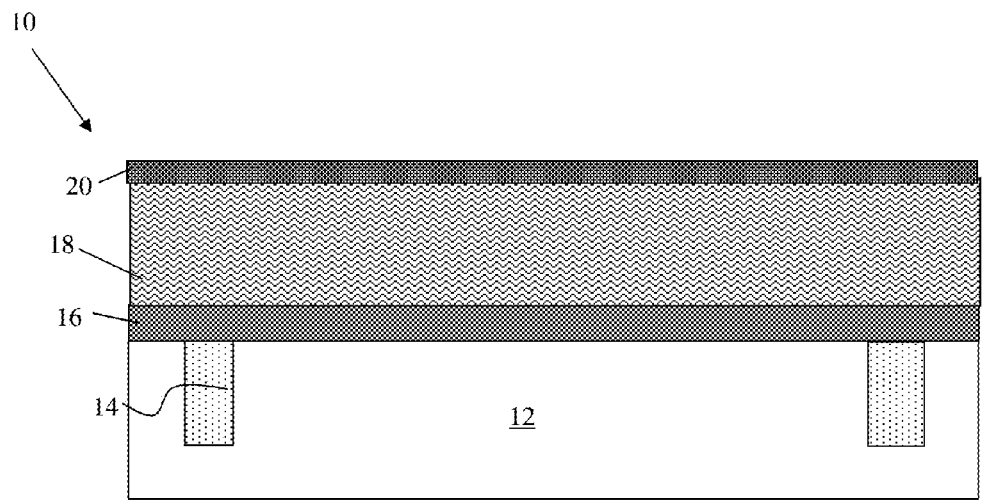
FIG. 1 shows a layered structure and respective fabrication processes in accordance with aspects of the present disclosure.

FIG. 1 shows a layered structure and respective fabrication processes in accordance with aspects of the present disclosure. In particular, the layered structure 10 includes a wafer or substrate 12 with shallow trench isolation (STI) structures 14. The substrate 12 can be, for example, bulk silicon or a silicon on insulator (SOI) with any appropriate doping. Doping can be altered in the region between the STI structures 14 by using an implant to lower collector resistance and fT. The STI structures 14 can be insulator material, e.g., oxide.

An intrinsic base layer 16 is formed on the surface of the substrate 12. In embodiments, the intrinsic base layer 16 can be a low temperature epitaxially grown material, e.g., Si or SiGe material or both. The intrinsic base layer (film) 16 can be undoped or may have p-type doping, e.g., boron with carbon doping to reduce diffusion of boron or a combination of undoped, p-type doped and n-type doped layers. In embodiments, the Ge material can have a concentration of between 0% to approximately 60%, for example (although other concentrations can also be used). The intrinsic base layer 16 can have a thickness of about 300 Å to about 5000 Å and more preferably between about 400 Å to about 4000 Å; although other dimensions are contemplated herein.

Still referring to FIG. 1, an N+ emitter layer 18 is formed on the intrinsic base layer 16. In embodiments, the N+ emitter layer 18 can be formed by a conventional deposition process, e.g., chemical vapor deposition (CVD) or epitaxial growth, to a thickness of about 100 Å to about 3000 Å; although other dimensions are contemplated herein. In embodiments, the N+ emitter layer 18 can be a highly doped Si or SiGe material or both, with doping of arsenic or phosphorous or both. An insulator layer 20 is formed on the N+ emitter layer 18. The insulator layer 20 can be an oxide material deposited to a thickness of about 50 Å or greater. In embodiments, the insulator layer 20 can be deposited by a conventional CVD process (or grown).

Figure 2:
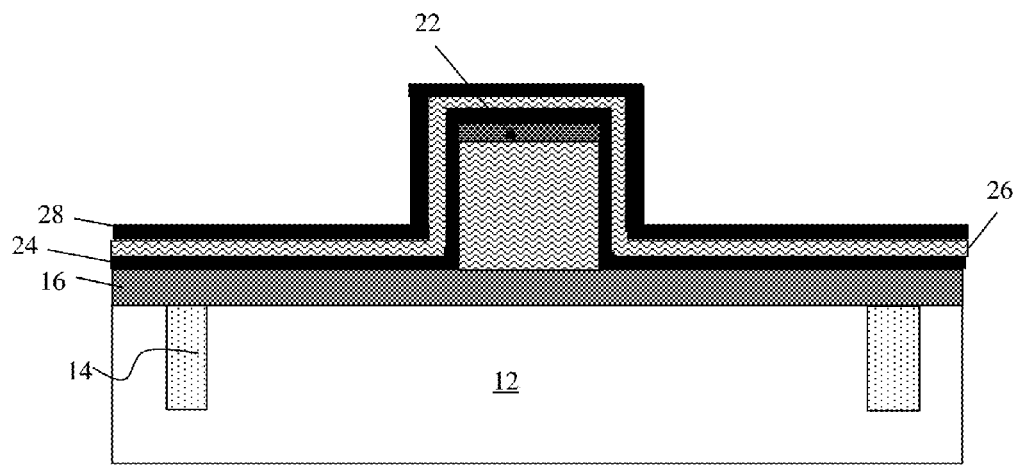
FIG. 2 shows a base region with stacked layers and respective fabrication processes in accordance with aspects of the present disclosure.

Referring to FIG. 2, a mesa region 22 is formed by conventional CMOS processes in accordance with aspects of the present disclosure. More particularly, the mesa region 22 includes the intrinsic base layer 16 (base) and the N+ emitter layer 18 (emitter) and is fabricated by forming a resist on the insulator layer 20, exposing the resist to energy (e.g., light) to form a pattern (opening) and etching the insulator layer 20 and N+ emitter layer 18 through the opening. In this process, the etching can be a reactive ion etching (RIE) or a wet etch with selective chemistries to the insulator layer 20 and N+ emitter layer 18, with the intrinsic base layer 16 acting as an etch stop layer.

Following the formation of the mesa region 22, layers 24, 26 and 28 can be sequentially deposited on the structure using conventional CVD processes. In embodiments, the layer 24 can be a nitride layer, the layer 26 can be an oxide layer and the layer 28 can be a nitride layer (thereby forming a nitride/oxide/nitride stack). The layers 24, 26, 28 can each be deposited to a thickness of about 100 Å to about 500 Å; although other dimensions are also contemplated herein.

Figure 3:
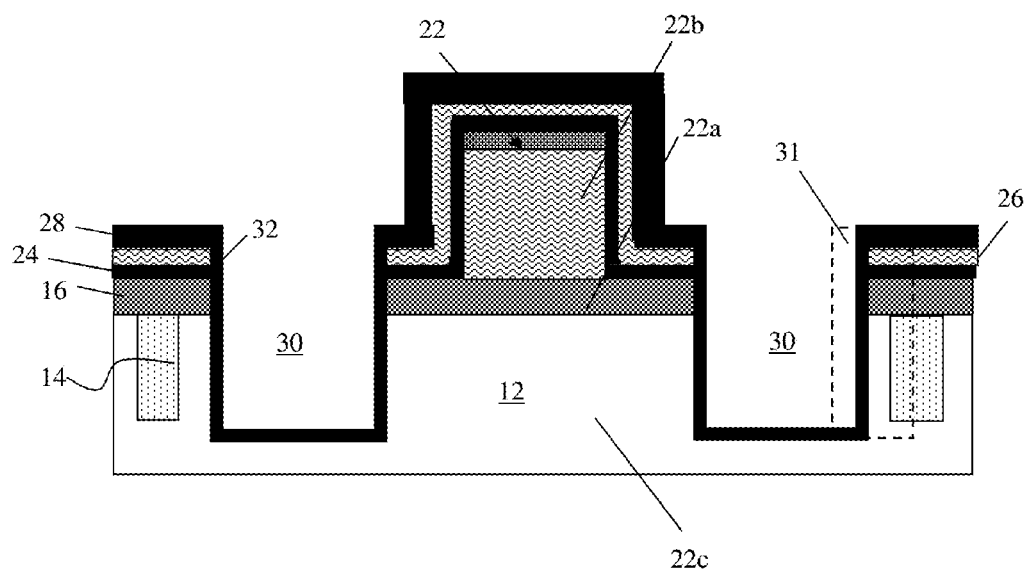
FIG. 3 shows trench(es) lined with stress material and respective fabrication processes in accordance with aspects of the present disclosure.

In FIG. 3, trench(es) 30 is formed in the substrate 12 by conventional lithography and etching processes as already described herein, on sides of the mesa 22. In embodiments, the trenches 30 will further define the intrinsic base region 22a and emitter region 22b, formed on collector region 22c (e.g., sub collector region). The trenches 30 can be formed through the layers 24, 26, 28 and can be adjacent to the STI structures 14. In optional embodiments (as represented by a dashed line 31), the trenches 30 can also extend partly through or entirely within the STI structures 14. In embodiments, the trenches 30 can have a depth of less than or greater than the depth of the STI structures 14 and, in one embodiment, can have a depth of about 0.5 um.

As further shown in FIG. 3, the trenches 30 can be lined with stress material 32. In embodiments, the stress material 32 is a nitride material, deposited by conventional blanket CVD processes to a thickness of about 100 Å to about 500 Å; although other dimensions are also contemplated herein.

In this way, the stress material 32 can be deposited over the entire surface of the structure, as shown by a thickened layer 28. In embodiments, an oxide passivation layer (also represented by reference numeral 32) can be deposited or grown under the stress material, e.g., between the substrate 12 and the nitride material. As should be understood by those of skill in the art, the stress material 32 can provide a compressive stress for an NPN HBT configuration or a tensile stress for a PNP HBT configuration, and will improve carrier mobility in the collector region of the HBT. In one embodiment, the stress material 32 is a compressive nitride of about 100 nm thick, providing a stress of up to 4 GPa.

Figure 4:
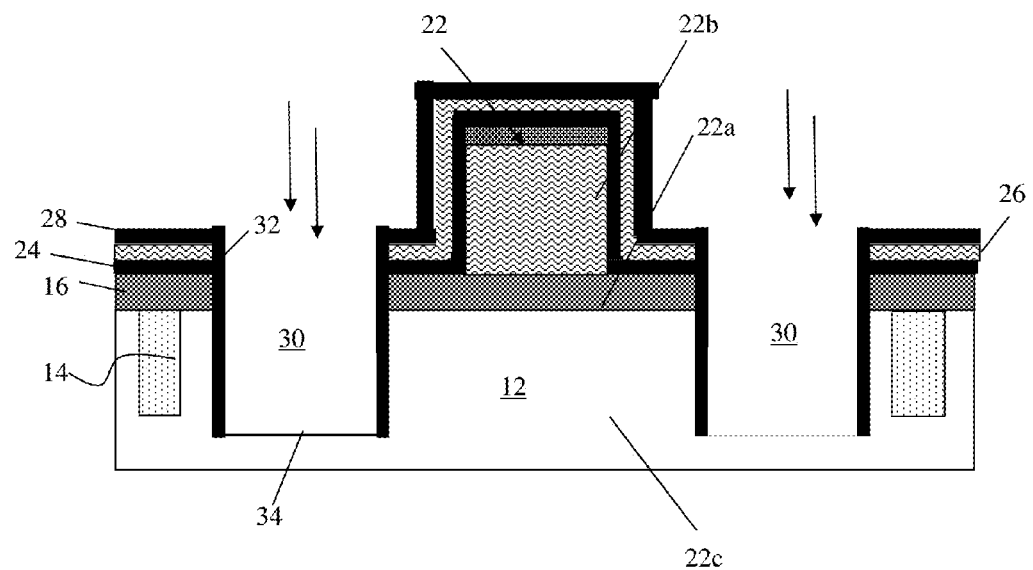
FIG. 4 shows a bottom surface of the trench without stress material and respective fabrication processes in accordance with aspects of the present disclosure.

As shown in FIG. 4, the stress material 32 is removed from the bottom surface 34 of the trench 30 in accordance with aspects of the present disclosure. In embodiments, the stress material 32 is removed by an anisotropic etching process, which will also remove excess stress material from other horizontal surfaces of the structure (as represented by a thinner layer 28). An optional subcollector implant can be provided at the bottom of the trench (as depicted by the arrows). In embodiments, the optional subcollector implant can be an N+ implant to reduce collector resistance.

Figure 5:
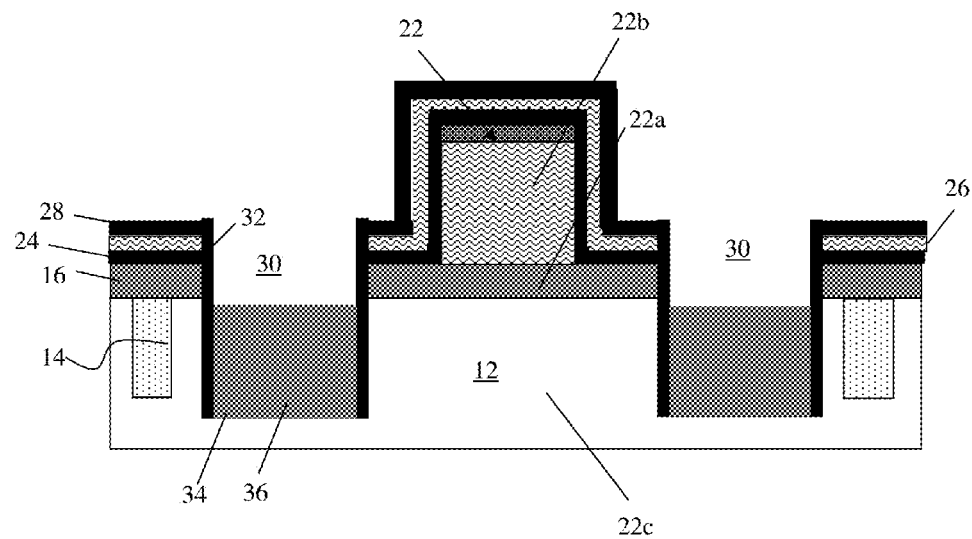
FIG. 5 shows the trench filled with semiconductor material and respective fabrication processes in accordance with aspects of the present disclosure.

FIG. 5 shows the trenches 30 filled with semiconductor material 36 in accordance with aspects of the present disclosure. In embodiments, the semiconductor material 36 can be, e.g., SiGe, SiC, Si or combinations thereof. In embodiments, the SiGe material or the SiC material can be capped with Si for purposes of subsequent fabrication processing. In embodiments, the semiconductor material 36 may be doped. The semiconductor material 36 can be deposited by a selective epitaxy growth process, starting from the exposed bottom surface 34 of the trench 30. It should also be understood by those of skill in the art that the semiconductor material 36 will not grow on the sidewalls of the trenches 30 due to the dielectric stress material 32.

In embodiments, the semiconductor material 36 is preferably grown to a height below or same as the intrinsic base layer 16 and will surround the collector region 22c and the base region 22a. The semiconductor material 36 within the trench 30 and surrounding the collector region 22c and the base region 22a can be a stress material to provide a high compressive stress (for an NPN HBT) resulting in further improvement in mobility in the collector region 22c and base region 22a. In embodiments, the semiconductor material 36 may be chosen such that it does not apply any additional stress on the collector region, if the stress material 32 on the sidewalls of the trench 30 has sufficient stress, e.g., if stress material 32 has 4 GPa of compressive stress, extra stress from material layer 36 is not required. On the other hand, if material 32 does not apply any stress then stress component from layer 36 helps improve the mobility in the collector region 22c.

In additional embodiments, a combination of SiC/Si/SiGe materials can provide a different stress to the collector region and base region to improve performance of both the collector region and the base region at the same time. The stressed nitride liner, e.g., stress material 32, can also provide an additional stress component to increase the device performance, e.g., improve performance of both the collector region and the base region at the same time.

Figure 6:
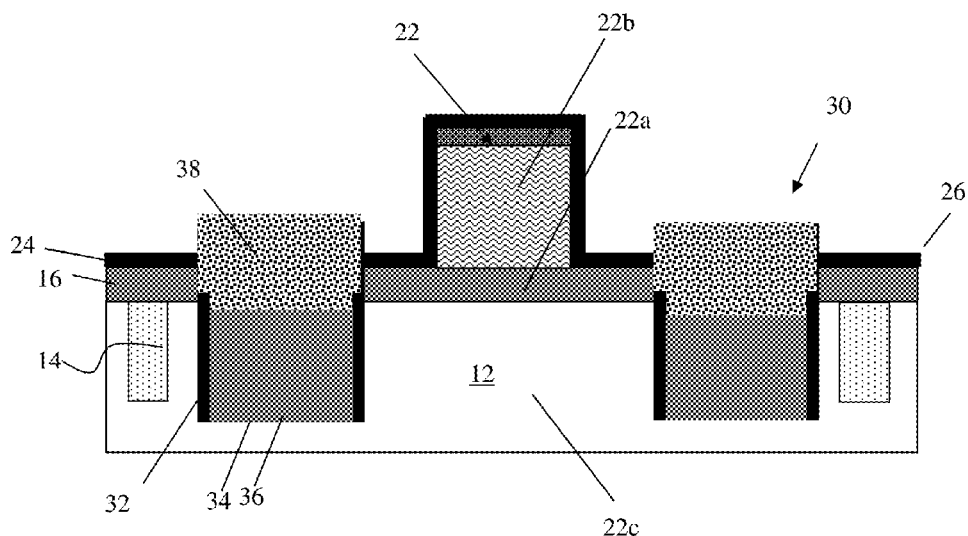
FIG. 6 shows additional structures and respective fabrication processes in accordance with aspects of the present disclosure.

FIG. 6 shows additional structures and respective fabrication processes in accordance with aspects of the present disclosure. For example, in embodiments, an oxide material is grown on the structure of FIG. 5 to cover the semiconductor material 36. As should be understood by those of skill in the art, the oxide material will only grow on the exposed semiconductor material 36. The spacer material, e.g., layers 26, 28, are removed, and the nitride material 32 within the trenches 30 is recessed (e.g., pulled down) by an over-etching process. In this way, the nitride material 32 within the trenches 30 can be pulled down to below the intrinsic base layer 16, for example, to open the side of the mesa region 22 for extrinsic base connection. As should be understood by those of skill in the art, the oxide material will protect the semiconductor material 36 during these processes. The oxide material can then be removed by a selective etching process (e.g., RIE with selective chemistry to the oxide material or a wet etch selective to oxide).

Still referring to FIG. 6, a highly doped semiconductor material 38 is grown on the exposed semiconductor material 36, in contact or linking with the intrinsic base layer 16. In embodiments, the highly doped semiconductor material 38 is grown above the intrinsic base layer 16, e.g., resulting in a raised extrinsic base which will lower Rb. The semiconductor material 38 can be, e.g., SiGe, although other materials or combinations of materials are also contemplated herein. For example, the highly doped semiconductor material 38 can be a combination of Si and SiGe, with Si being a first layer followed by SiGe. In embodiments, the highly doped semiconductor material 38 can be tuned by having a layer of undoped material, followed by doped material, followed by undoped material, or combinations thereof. In further embodiments, the SiGe % can be graded along the growth. The dopant can be, e.g., a P+ dopant, such as boron for NPN HBT. In embodiments, the highly doped semiconductor material 38 will form the extrinsic base of the HBT, connecting or linking to the intrinsic base layer 16, which will also stress the intrinsic base for lower base resistance (Rb).

Figure 7:
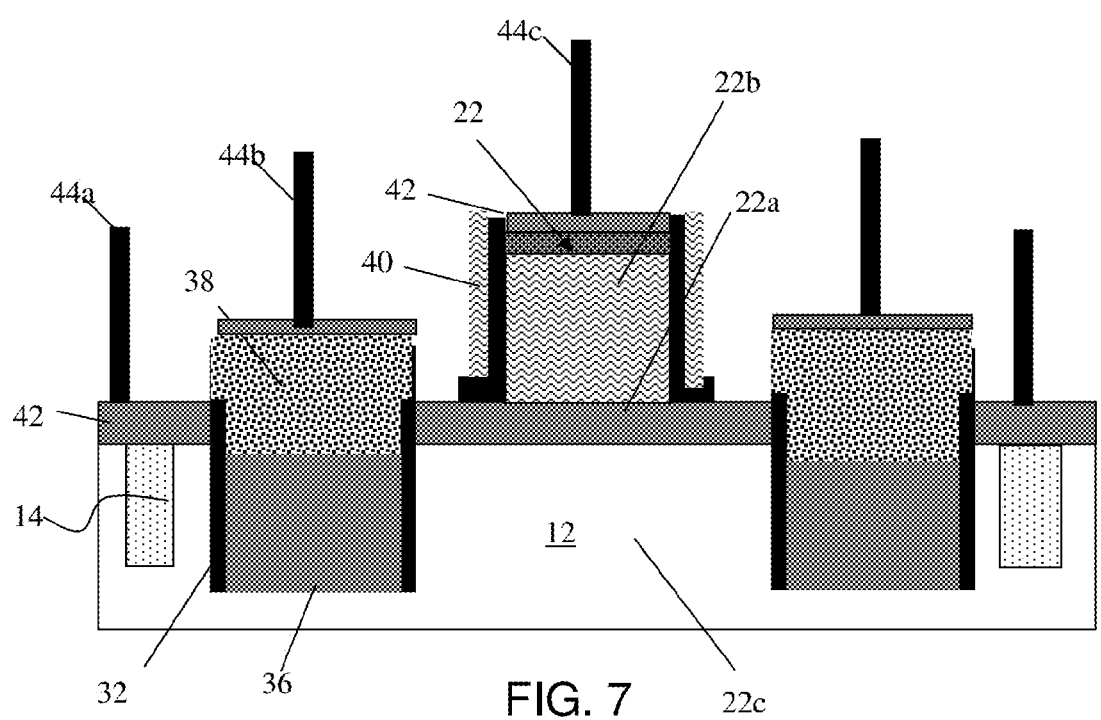
FIG. 7 shows contacts on the base, collector and emitter regions (amongst other features) and respective fabrication processes in accordance with aspects of the present disclosure.

In FIG. 7, an oxide spacer 40 is formed on the nitride material 24 of the mesa region 22. In embodiments, the oxide spacer 40 can be formed by a blanket deposition process, followed by an anisotropic etching process to remove any excess oxide material. Any exposed nitride material 24 can also be removed by a selective etching process.

Silicide contacts regions 42 are formed on the mesa region 22 and the semiconductor material 38, including for collector contacts. As should be understood by those of skill in the art, the silicide process begins with deposition of a thin transition metal layer, e.g., nickel, cobalt or titanium, over fully formed and patterned semiconductor devices. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contact regions 42. The silicide contact region 42 on the emitter region can also lower Re and with a clean emitter interface provide improved device control.

A plurality of contacts 44a, 44b and 44c are formed on the structure using conventional CMOS processes. As should be understood by those of skill in the art, the contacts include a collector contact 44a, a base contact 44b and an emitter contact 44c. To fabricate the contacts 44a, 44b and 44c, for example, an interlevel dielectric layer can be formed on the structure. A resist can be formed on the interlevel dielectric layer, followed by exposure to energy to form a pattern (openings). Vias can then be etched into the interlevel dielectric layer through the openings. Metal material such as copper or aluminum can be deposited within the vias, in contact with the silicide contact regions 42. Any residual material can then be removed by a conventional chemical mechanical planarization (CMP) process.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A bipolar junction transistor structure comprising:
a collector region, an emitter region and a base region; and
stress material formed within a trench of a substrate and surrounding at least the collector region and the base region, wherein one of:
the stress material is a tensile stress material for a PNP bipolar structure provided below an intrinsic base layer of the base region, and
the stress material is a compressive stress material for a NPN bipolar structure provided below an intrinsic base layer of the base region.

2. The bipolar junction transistor structure of claim 1, wherein the stress material is SiGe, SiC, Si or combinations thereof.

3. The bipolar junction transistor structure of claim 1, wherein the stress material further comprises a stress liner on sidewalls of the trench to introduce a stress to the collector region.

4. A bipolar junction transistor structure comprising:
a collector region, an emitter region and a base region; and
stress material formed within a trench of a substrate and surrounding at least the collector region and the base region,
wherein the stress material includes a doped semiconductor material formed above, and linking to, the intrinsic base layer.

5. The bipolar junction transistor structure of claim 4, further comprising a stress liner formed on a sidewall of the trench and recessed to permit the linking of the doped semiconductor material to the intrinsic base layer.

6. The bipolar junction transistor structure of claim 4, wherein the doped semiconductor material is compressively stressed for a NPN bipolar structure.

7. The bipolar junction transistor structure of claim 4, wherein the doped semiconductor material includes a layer of undoped material, a doped material on the undoped material and an undoped layer on the doped material.

8. The bipolar junction transistor structure of claim 4, wherein the doped semiconductor material is SiGe.

9. The bipolar junction transistor structure of claim 4, further comprising a silicide contact region in contact with the emitter region.

10. A heterojunction bipolar transistor comprising:
a collector region formed of a substrate material;
a base region above the collector region and formed of an intrinsic base layer;
an emitter region above the base region and formed of an emitter material;
a trench formed in the substrate and surrounding the base region and the collector region; and
stress material formed within the trench and providing a stress component to the collector region and the base region.

11. The structure of claim 10, wherein the stress material is a compressive stress material of semiconductor material provided below the intrinsic base layer of the base region.

12. The structure of claim 10, wherein the stress material further comprises a recessed stress liner on sidewalls of the trench to introduce a stress to the collector region.

13. The structure of claim 12, wherein the stress material further includes a raised doped semiconductor material formed higher, and linking to, the intrinsic base layer.

14. The structure of claim 13, wherein the raised doped semiconductor material includes a layer of undoped semiconductor material, a doped semiconductor material on the undoped material and an undoped semiconductor layer on the doped semiconductor material.

15. The structure of claim 14, further comprising a silicide contact region in contact with the emitter region.

* * * * *